United States Patent Office 3,782,952
Patented Jan. 1, 1974

3,782,952

LIGHT-SENSITIVE COMPOSITION OF A TETRA (EPOXY-PROPOXYPHENYL)-LOWER ALKANE AND AN INITIATOR

Eugene Golda, Monsey, and Delos E. Bown, White Plains, N.Y., assignors to Polychrome Corporation, Yonkers, N.Y.

No Drawing. Filed Apr. 1, 1971, Ser. No. 130,534
**Int. Cl. G03c *1/66***
U.S. Cl. 96—93 7 Claims

ABSTRACT OF THE DISCLOSURE

A light-sensitive composition comprising a tetra(epoxy-propoxyphenyl)-lower alkane and a light-activated polymerization initiator.

This invention relates to light-sensitive compositions based on a particular type of epoxide resin, and more particularly to offset printing plates having coated thereon a thin layer of a light-sensitive composition based on a particular type of epoxide resin and a sensitizer that is hardenable by exposure to light to form image-printing areas of the hardened epoxy resin.

Offset printing plates, particularly planographic printing plates, utilize a surface having areas of differing hydrophilic-oleophilic characteristics. The printing areas, or image areas, are oleophilic and thus receptive of greasy printing ink which is transferred to the surface to be printed, usually by means of an intermediate "blanket" cylinder. The background areas, or non-image areas, are hydrophilic and thus receptive of an aqueous dampening fluid, or fountain solution, which helps to reject the greasy ink so that no ink is transferred from such areas. Typically, such a plate is made by uniformly coating a base sheet hydrophilic in character with a light-sensitive composition, exposing the coated sheet to light through a transparency having a positive or negative image of the object desired to be printed, and then removing the coating from the non-image areas to expose the base.

The compositions of this invention are negative acting. That is, they are hardened by light and thus are exposed through negative image transparencies to harden coatings thereof in the image area.

Epoxy resins in general are known in the lithographic art for use as components of the light-sensitive coatings on plates. Such resins as are known, however, have a number of disadvantages and thus are not presently used, to our knowledge, on commercially available lithographic plates. One shortcoming of epoxy resins is that they are rather complex insofar as they need groups such as double or triple bonds to photo-initiate polymerization. Another is that they lack sufficient differential of solubility between the unexposed areas and the exposed-hardened areas, and thus are difficult to develop easily by removal of non-image areas and do not produce sharp images, particularly of fine detail and line work and half-tones. Still another disadvantage is that polymerizable epoxy resins having requisite properties for satisfactory coatings on base sheets usually are already of high molecular weight and thus are difficult or unable to be photopolymerized to a significant extent sufficient to produce a hardened image having requisite properties of a printing surface, such as durability, hardness and adherence.

It is an object of this invention to provide improved offset printing plates based on epoxy resins. Another object is to provide light-sensitive compositions based on a particular type of epoxide resin, which compositions have properties eminently suited to all phases of platemaking and printing usage.

Broadly, the light-sensitive compositions of this invention contain a polymerizable, relatively simple and small epoxide resin of the type alpha, alpha, omega, omega-tetra (epoxy-propoxyphenyl)-lower alkane, preferably 1,1,2,2-tetra(2,3 - epoxy - propoxyphenyl)-ethane, and a light-activated polymerization initiator. More particularly, the epoxide resins mentioned have the general formula

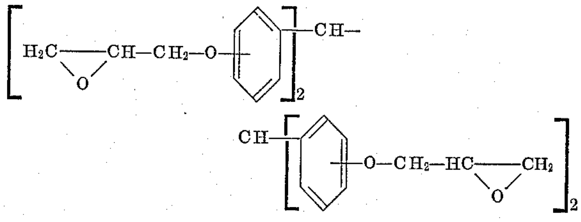

and include lower alkyl homologues and lower alkyl substituted compounds thereof; the photoinitiators are chromates and dichromates of the alkali metals, the alkaline earth metals and ammonium, and polyhalogenated organic compounds having relatively low bond dissociation energies, such as iodoform, carbon tetrabromide, carbon tetrachloride, tetra-bromo-o-cresol, tetrachlorobenzene and 1,2,3,4-tetrabromobutane, that readily yield a first halogen-free radical at dissociation energies below about 75 kilocalories per mol.

The epoxide resins of the type described are substantially water-insoluble solids that can readily be dissolved in common organic solvents for the purposes of coating the compositions onto suitable base sheets and of removing the coating in unexposed areas to develop the plates. Typical and preferred solvents are acetone, dimethylformamide, methyl-ethyl-ketone, methyl Cellosolve, and mixtures thereof. After exposure to light, particularly actinic light from a conventional lithographic carbon arc source, the coated composition is rendered insolvent to any practical extent in such solvents due to extensive polymerization, especially including cross-linking, through the relatively many epoxy sites. The tremendous difference in solubility between exposed and unexposed areas results in unusually sharp, well-defined image areas, even with fine detail and line work and half-tones. The extensive polymerization of the coating on the plate also serves to lock in chemically and/or mechanically the photoinitiator as well as to provide a very tough and durable resin that adheres remarkably well to the base sheet, and thus gives long press life.

A varying amount of the photoinitiator can be used, depending upon such factors as the particular initiator selected, the "speed" of the plate, that is, the time necessary to fully expose the plate and harden the image areas, and the amount of resin in such areas for desired durability. In general, the less initiator relative to the resin, the more exposure time is required but a longer-lasting plate results, while a higher proportion of initiator to resin increases speed but tends to produce an image of less strength. With the foregoing parameters, the amount of photoinitiator should be from about 0.1 to about 1.0 part by weight per part of epoxide resin, desirably about 0.2 to about 0.5 part, and for chromate or dichromate compounds preferably about 0.25 to about 0.4 part.

Coating solutions of the light-sensitive compositions can be made up in strengths of about 1% to about 10% by weight based on the epoxy resin solids, preferably around 2% to 5%. The solutions are then applied to base sheets and dried so as to form a solid coating of the light-sensitive composition in an amount of about 10 to about 200 mg. per square foot, preferably about 20 to about 80 mg./ft.$^2$. Exposure times for such plates are from about one-half to about five minutes, typically about 1 to 3 minutes.

As base sheets there can be used materials known and used in the lithographic art, for example, zinc, copper, aluminum, treated papers and plastic films such as cellulose acetate and Mylar nylon. Aluminum is the preferred base material, although for the making of printed circuits, an important application, copper is used.

To develop the exposed plates, the coating solvents mentioned above can be used. Because of the great solubility differential, water in as much as equal parts can be used as a co-solvent where the photoinitiator of the composition is water-soluble, for example, the chromates and dichromates.

A modification of the instant compositions involves the inclusion therein of certain kinds of other resinous material as a supplement. These other resins can serve to enhance or to provide additional advantageous properties of the hardened epoxy resin printing image areas, for example, resiliency, ink-receptivity, adhesion and durability. One type of such resins is water-soluble, polar solvent-soluble resins such as polyvinyl alcohol, polyvinyl pyrrolidone, polyvinyl acetate, polyvinyl chloride and polyvinyl acrylamide. They can be used in amounts up to about one-third the amount by weight of the epoxide resin, and either copolymerize and crosslink with the epoxy resin or are mechanically entrapped thereby. An important advantage of these supplementary resins is that, due to their water solubility, the plates can be developed with an aqueous or substantially aqueous developer medium because water dissolution of the supplementary resin physically breaks down the unexposed coating and removes even the epoxide resin therein, but does not effect the hardened areas. Up to about the same amount of an alkali-soluble phenol-aldehyde resole or novolak resin can also be used as a supplementary resin. These, too, either copolymerize with the epoxide resin or are entrapped therein. Plates with such resins in the coating can be developed with mildly alkaline solutions, e.g., pH about 9 to about 12.

The following examples illustrate the compositions of this invention and their use; the parts given are by weight.

EXAMPLE 1

Six parts of a 1,1,2,2-tetra[2,3-epoxypropoxyphenyl] ethane resin available from Shell Chemical Company under the trade name Epon 1031 and 2 parts of ammonium dichromate were dissolved in 160 parts of methyl Cellosolve and 40 parts of dimethyl-formamide, and whirl coated onto cleaned aluminum sheets to form plates with a coating of about 40 mg./ft.$^2$. A plate was exposed to actinic light in a Nu-Arc carbon arc exposure frame for about 1½ minutes through a negative image transparency. Unexposed areas of the coating were removed with the same solvents used for the coating solution. A fine quality printing plate having sharp image details was thus prepared, and used to print excellent copies.

Variations of the foregoing example were made as follows:

(a) As coating solution solvent were used methyl Cellosolve, dimethyl-formamide and methyl-ethyl-ketone, separately and in equal part mixtures.

(b) As photoinitiators were used potassium dichromate, sodium dichromate, ammonium chromate, iodoform and carbon tetrabromide.

(c) The amount of photoinitiator was reduced to one part and increased to four parts.

(d) The coating solution concentration was doubled by halving the amount of solvent, and the plate was coated with about 100 mg./ft.$^2$ of solids.

(e) Equal parts of water and methyl Cellosolve were used to develop the plate.

(f) Aluminum sheets were used that had been brush grained, anodized or treated with a hot solution of potassium zirconium hexafluoride.

Substantially the same results (except for exposure time, which varied between about one and about three minutes), namely, high quality images having fine, strong details and a durable printing plate, were obtained with each variation.

EXAMPLE 2

Plates were made with coating solutions as described in Example 1 except that 2 parts of the following resins were added to the solutions: "Vinal" FH–100 polyvinyl alcohol; "PVP" K–30 and K–90 polyvinyl pyrrolidone; "Vinac" B–7 polyvinyl acetate; "Cyanamer" PAM–200 and P–250 polyvinyl acrylamide; "Bakelite" 2620 alkali-soluble phenol-formaldehyde resole resin. After exposure, the plates were developed with water and methyl Cellosolve (1:1), and with water containing 5% Dupanol, a lauryl sulfate wetting agent, except for the plate containing the phenol-formaldehyde resin in the coating, which was developed with a sodium hydroxide solution of pH about 10. Fine quality plates having excellent printing characteristics and long life were obtained.

EXAMPLE 3

A copper-clad aluminum sheet was made into a plate as described in Example 1. After development, ferric nitrate solution of about 45° Bé. was used to etch the exposed copper in the non-image areas. A bimetallic printing plate of high quality and durability was thus produced. A printed circuit board can be made in the same way on a copper clad electrically insulating sheet instead of copper on aluminum.

It will be apparent to persons skilled in the art that numerous changes can be made in the ingredients, proportions and conditions described above without departing from the scope of this invention as disclosed hereinbefore and as defined in the appended claims.

We claim:

1. A light sensitive composition comprising a tetra-(epoxy-propoxyphenyl)-lower alkane and a light-activated polymerization initiator of a chromate or dichromate of an alkali metal, an alkaline earth metal or ammonia, or a polyhalogenated organic compound that yields a halogen-free radical at a relatively low bond dissociation energy.

2. A light-sensitive composition according to claim 1 wherein said initiator is ammonium, potassium, or sodium chromate or dichromate, iodoform, carbon tetrabromide, carbon tetrachloride, tetrabromo-o-cresol, tetrachlorobenzene or tetrabromobutane.

3. A light-sensitive composition according to claim 1 wherein said alkane is 1,1,2,2-tetra(2,3-epoxypropoxyphenyl)-ethane.

4. A light-sensitive composition according to claim 1 wherein said composition contains from about 0.1 to about 1 part by weight of said initiator per part of said alkane.

5. A light-sensitive composition according to claim 1 wherein said composition contains from about 0.2 to about 0.5 part by weight of said initiator per part of said alkane.

6. A light-sensitive composition according to claim 1 wherein said composition additionally contains up to about one-third the amount by weight of said alkane of a water-soluble, polar-solvent soluble or alkali-soluble supplementary resinous material.

7. A light-sensitive composition according to claim 6 wherein said supplementary resinous material is polyvinyl alcohol, polyvinyl acetate, polyvinyl pyrrolidone, polyvinyl chloride, polyvinyl acrylamide, phenol-aldehyde) resole or phenol-aldehyde novolak.

References Cited

UNITED STATES PATENTS

| | | | |
|---|---|---|---|
| 2,806,016 | 9/1957 | Schwarzer | 260—47 |
| 3,484,239 | 12/1969 | Steppan | 96—115 R |
| 3,498,786 | 3/1970 | Notley | 96—115 R |

NORMAN G. TORCHIN, Primary Examiner

J. L. GOODROW, Assistant Examiner

U.S. Cl. X.R.

96—115 P; 204—159.15